(12) United States Patent
Tung

(10) Patent No.: US 9,576,859 B2
(45) Date of Patent: Feb. 21, 2017

(54) SEMICONDUCTOR DEVICE AND METHOD FOR FABRICATING THE SAME

(71) Applicant: UNITED MICROELECTRONICS CORP., Hsinchu (TW)

(72) Inventor: Yu-Cheng Tung, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/255,316

(22) Filed: Sep. 2, 2016

(65) Prior Publication Data

US 2016/0372381 A1    Dec. 22, 2016

Related U.S. Application Data

(63) Continuation of application No. 14/539,175, filed on Nov. 12, 2014, now Pat. No. 9,496,182.

(30) Foreign Application Priority Data

Oct. 1, 2014   (TW) .............................. 103134233 A

(51) Int. Cl.
| | | |
|---|---|---|
| H01L 21/76 | (2006.01) | |
| H01L 29/78 | (2006.01) | |
| H01L 21/762 | (2006.01) | |
| H01L 21/28 | (2006.01) | |
| H01L 27/088 | (2006.01) | |
| H01L 21/8238 | (2006.01) | |
| H01L 29/06 | (2006.01) | |
| H01L 29/66 | (2006.01) | |
| H01L 29/423 | (2006.01) | |
| H01L 27/092 | (2006.01) | |

(52) U.S. Cl.
CPC ................. *H01L 21/823821* (2013.01); *H01L 21/823814* (2013.01); *H01L 21/823842* (2013.01); *H01L 21/823878* (2013.01); *H01L 27/0924* (2013.01); *H01L 29/0649* (2013.01); *H01L 29/42364* (2013.01); *H01L 29/66545* (2013.01)

(58) Field of Classification Search
CPC .................. H01L 21/28123; H01L 21/823878; H01L 27/0207; H01L 27/092
USPC ............. 257/77, 368, 390, E27.06, E29.104, 257/E29.255; 438/299, 254, 589
See application file for complete search history.

(56) References Cited

U.S. PATENT DOCUMENTS

| | | | |
|---|---|---|---|
| 7,655,980 B1 | 2/2010 | Chao et al. | |
| 8,487,348 B2 | 7/2013 | Cea et al. | |
| 8,735,993 B2 | 5/2014 | Lo et al. | |
| 8,878,309 B1 | 11/2014 | Hong et al. | |

(Continued)

*Primary Examiner* — Brian Turner
(74) *Attorney, Agent, or Firm* — WPAT, PC; Justin King

(57) ABSTRACT

A method for fabricating a semiconductor device comprises: Firstly, a semiconductor fin comprising a first sub-fin and a second sub-fin protruding from a surface of a substrate is provided. An isolation structure having an opening extending therein is then provided in the semiconductor fin to electrically isolate the first sub-fin and the second sub-fin. Subsequently, a first dummy structure disposed on the first isolation structure and having at least one metal layer entirely overlapping on the first isolation structure along a long axis of the semiconductor fin is formed, wherein the metal layer laterally conformally extends downwards into the opening and extends upwards beyond the first isolation structure along the long axis of the semiconductor fin, so as to form a stepped structure overlapping on sidewalls and a bottom of the opening, a portion of the first sub-fin and a portion of the second sub-fin.

18 Claims, 13 Drawing Sheets

(56) References Cited

U.S. PATENT DOCUMENTS

| | | |
|---|---|---|
| 2006/0261414 A1 | 11/2006 | Hovis et al. |
| 2011/0147765 A1 | 6/2011 | Huang et al. |
| 2013/0020613 A1 | 1/2013 | Mieno |
| 2013/0187237 A1 | 7/2013 | Yu et al. |
| 2014/0106531 A1 | 4/2014 | Cabral, Jr. et al. |
| 2014/0117454 A1 | 5/2014 | Liu et al. |

SEMICONDUCTOR DEVICE AND METHOD FOR FABRICATING THE SAME

This application is a continuation application (CA) of U.S. application Ser. No. 14/539,175, filed on Nov. 12, 2014. The entire disclosure of U.S. application Ser. No. 14/539,175 is incorporated herein by reference.

BACKGROUND

Technical Field

The disclosure relates in generally related to a semiconductor device and method for fabricating the same, and more particularly to a device with a fin field-effect transistor (FinFET) and method for fabricating the same.

Description of the Related Art

As the evolution of semiconductor process, technology node has progressed into nanometer-scale phenomena, a semiconductor device with higher functional density is provided. However, the critical sizes and features dimension of the semiconductor device are simultaneously shrunk small enough to make it challenging to produce a semiconductor device with the advantages of higher functional density without deteriorating the device performance. For overcoming the challenge, a device with a three-dimension design, such as a FinFET, is provided.

A FinFET is typically made by steps as follows: A portion of a silicon layer disposed on a substrate is removed by an etch process to form a vertical fin protruding from a surface of the substrate. A gate structure is then provided covering on the top surface and the sidewalls of the vertical fin to form a channel in the vertical fin, thereby an active region expending form the top surface to the sidewalls of the vertical fin can be identified. A gate structure is then formed on the vertical fin. In addition, a strained source/drain may be formed in the region of the vertical fin adjacent to the gate structure by an optional epitaxial growth process of strained silicon/silicon-germanium (Si/SiGe) material in order to improve the carrier mobility of the FinFET.

Generally, a FinFET structure may comprise a plurality of FinFETs each of which has a vertical fin protruding from a surface of the substrate, a gap with a step height may occur between two adjacent vertical fins after the gate structures of the corresponding FinFETs are formed on the vertical fins, and the topography of the FinFET structure may get more uneven when the gate structures that are respectively formed on different vertical fins have different device pattern density. Thus dishing problems may not still remain even if a polarization process, such as a chemical mechanical polishing (CMP) process, has been carried out on the surface of the FinFET structure, and the performance and yield of the subsequent processes performed on the surface of the FinFET structure may be deteriorated due to the roughness and dishing. In order to resolve the problems, a plurality of dummy stacks may be formed on insulation structures, such as shallow trench isolation (STI), disposed between two adjacent gate structures at the stage of forming the gate structures to provide an even local pattern density as well as to mitigate the dishing problems.

However, this approach still has some drawbacks. Because the dummy stacks of the prior art and the gate structures are not formed at the same plane, the dishing problems seem inevitable due to the height difference between the dummy stacks and the gate structures, such that the FinFET structure may be defect resulted from the uneven force generated by the subsequent processes performed on the surface of the FinFET structure. Therefore, there is a need of providing an improved semiconductor device and method for fabricating the same to obviate the drawbacks encountered from the prior art.

SUMMARY

One aspect of the present invention is to provide a semiconductor device, wherein the semiconductor device comprises a substrate, a semiconductor fin, a first isolation structure and a first dummy structure. The semiconductor fin comprises a first sub-fin and a second sub-fin protruding from a surface of the substrate. The first isolation structure is disposed in the semiconductor fin used for electrically isolating the first sub-fin and the second sub-fin. The first dummy structure is disposed on the first isolation structure and laterally extends beyond the first isolation structure along a long axis of the semiconductor fin, so as to overlap a portion of the first sub-fin and a portion of the second sub-fin.

According to another aspect of the present invention, a method for fabricating a semiconductor device is disclosed, wherein the method comprises steps as follows: Firstly, a semiconductor fin comprising a first sub-fin and a second sub-fin protruding from a surface of a substrate is provided. An isolation structure having an opening extending therein is then provided in the semiconductor fin to electrically isolate the first sub-fin and the second sub-fin. Subsequently, a first dummy structure disposed on the first isolation structure and having at least one metal layer entirely overlapping on the first isolation structure along a long axis of the semiconductor fin is formed, wherein the metal layer laterally conformally extends downwards into the opening formed in the first isolation structure and extends upwards beyond the first isolation structure along the long axis of the semiconductor fin, so as to form a stepped structure overlapping on sidewalls and a bottom of the opening, a portion of the first sub-fin and a portion of the second sub-fin.

In accordance with the aforementioned embodiments of the present invention, a semiconductor device and method for fabricating the same are provided. A substrate having a surface from which a semiconductor fin protrudes is provided. An isolation structure is then provided in the semiconductor fin to divide the semiconductor fin into a first sub-fin and a second sub-fin and electrically isolate the first sub-fin and the second sub-fin. Subsequently, a plurality of gate structures are formed on the first sub-fin and the second sub-fin, and at least one dummy structure is formed on the isolation structure by the identical process for forming the gate structures, wherein the dummy structure laterally extends beyond the first isolation structure along a long axis of the semiconductor fin in a manner of overlapping a portion of the first sub-fin and a portion of the second sub-fin.

Since the isolation structure has a top surface substantially conformal to the top surfaces of the first sub-fin and the second sub-fin, the top surfaces of the isolation structure, the first sub-fin and the second sub-fin can form a plane. In addition, because the dummy structure and the gate structures are formed by the same process for patterning the same material layers coving on the plane constituted by the top surfaces of the isolation structure, the first sub-fin and the second sub-fin, the dummy structure and the gate structures can have an identical height measured from the bottom of the substrate to the top surface thereof. Thereby, an even local pattern density can be provided by a proper arrangement of the dummy structure formed at the peripheral region of the gate structures, the dishing problems and the defect of the semiconductor device resulting from the uneven force of the subsequent processes performed on the semiconductor fin thus can be avoided.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A' illustrates a cross-sectional view of the substrate and the fin structure taken along with the line S1 shown on the FIG. 1A;

FIG. 1B' is a top view illustrated in accordance with the structure of FIG. 1B.

FIG. 1H' is a cross-sectional view illustrating a semiconductor IC having a at least one FinFET and a dummy structure in accordance with another embodiment of the present invention;

DETAILED DESCRIPTION

Figure 1A:
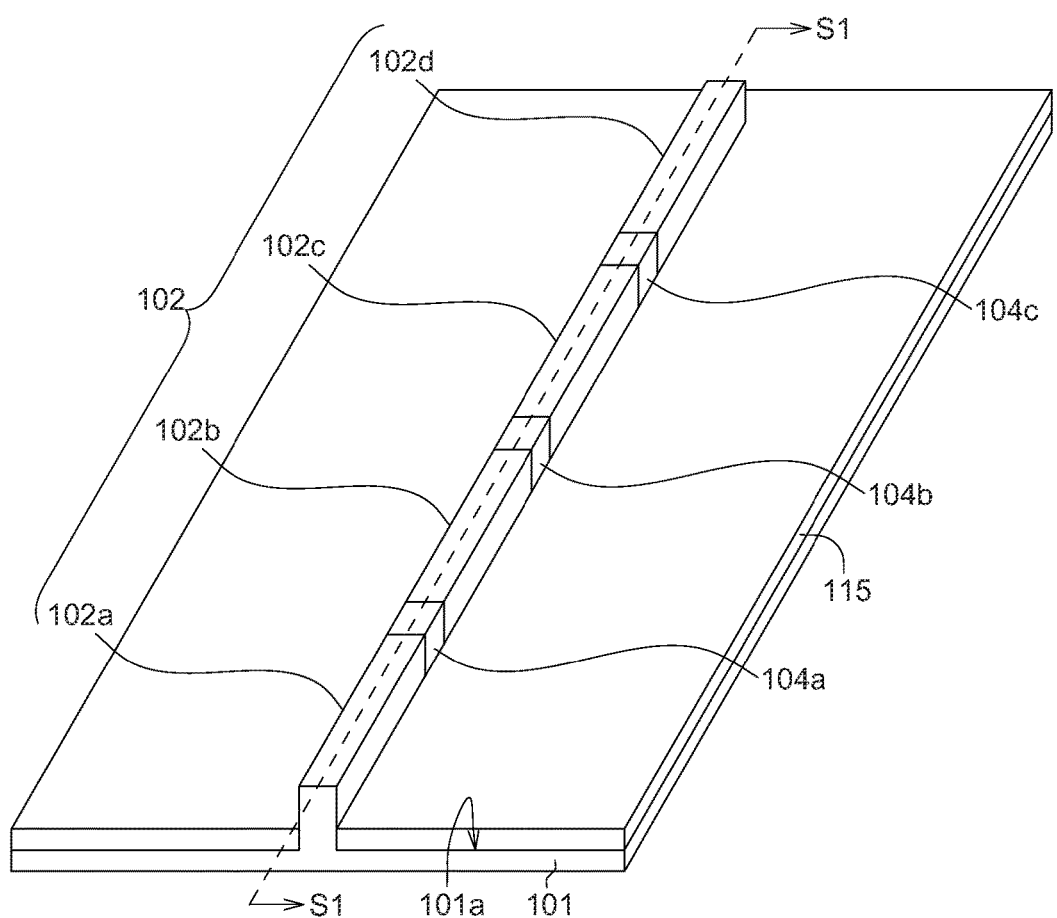
FIG. 1A is a prospective view illustrating a substrate having a fin structure in accordance with one embodiment of the present invention.
Figure 1A:
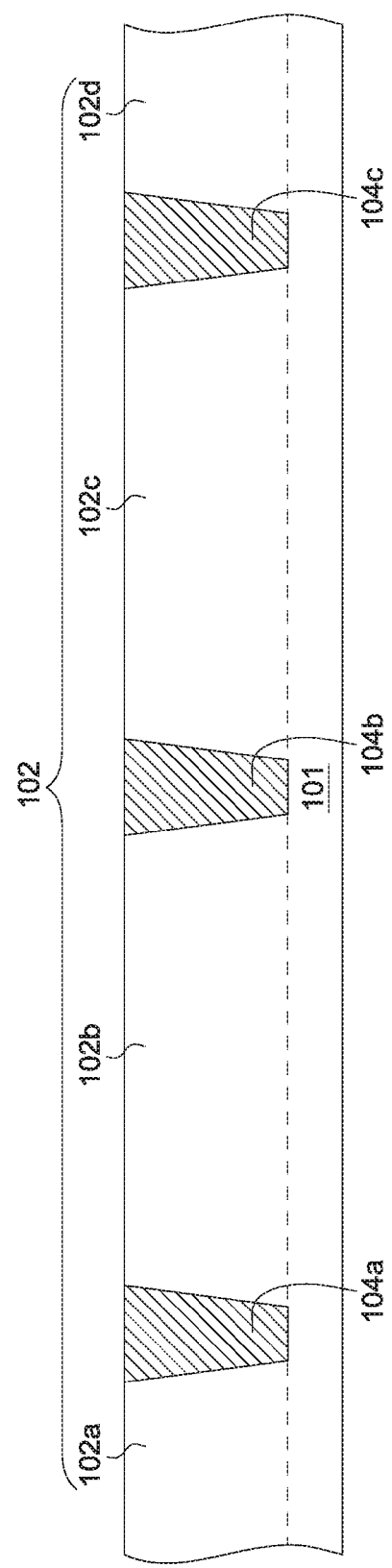

The embodiments as illustrated below provide a semiconductor device and method for fabricating the same. The present invention will now be described more specifically with reference to the following embodiments illustrating the method for fabricating a semiconductor integrated circuit (IC) 100 having at least one FinFET.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

The method for fabricating the semiconductor IC comprises several steps as follows: Firstly, a substrate 101 is provided. In some embodiments of the present invention, the substrate 101 may comprise a poly-silicon layer. In some other embodiments of the present invention, the substrate 101 may further comprise other suitable crystalline semiconductor materials, such as single-crystalline germanium (Ge), other suitable compound semiconductor, such as silicon carbide (SiC), gallium arsenide (GaAs), gallium phosphide (Gap), iodine phosphide (IP), arsenic iodine (Asp or antimony iodide (SbI), or the arbitrary combinations thereof. In yet other embodiments, the substrate 101 may be a silicon-on-insulator (SOI) substrate having an isolation layer. In the present embodiment, the substrate 101 preferably is a poly-silicon wafer.

A photoresist layer (not shown) patterned by a lithography process is then formed on the substrate 101. Next, an etching process is performed to remove a portion of the substrate 101 and expose a surface 101a of the substrate 101, whereby a fin structure 102 protruding from the surface 101a of the substrate 101 is provided. In the present embodiment, the fin structure 102 is silicon fin (Si-fin) protruding from the surface 102a of the poly-silicon wafer.

Thereafter, a dielectric layer 115 is formed on the exposed surface 101a of the substrate 101, so as to expose a portion of the fin structure 102. Of note that, in some embodiment, the substrate 101 may have a plurality of identical fin structures 102 formed thereon. For the purpose of clear description, mere a single fin structure 102 protruding from the surface 101a of the substrate 101 is illustrated.

After the fin structure 102 is formed, another etching process is performed to form a plurality of trenches in the fin structure 102; a dielectric material is then filled in the trenches and planarized to form a plurality of isolation structures used to divide the fin structure 102 into a plurality of sub-fins. FIG. 1A is a prospective view illustrating a substrate 101 having a fin structure 102 in accordance with one embodiment of the present invention; and FIG. 1A' illustrates a cross-sectional view of the substrate 101 and the fin structure 102 taken along with the line 51 (also referred to as the long axis of the fin structure 102) shown on the FIG. 1A. In the present embodiment, for example, there are three STI structures 104a, 104b and 104c formed in the fin structure 102 to divide the fin structure 102 into four sub-fins, such as sub-fins 102a, 102b, 102c and 102d, wherein the top surfaces of the STI structures 104a, 104b and 104c and the top surfaces of the sub-fins 102a, 102b, 102c and 102d constitute a plane. In other words, the top surfaces of the STI structures 104a, 104b and 104c and the top surfaces of the sub-fins 102a, 102b, 102c and 102d form a flat surface and have the same height measuring from the bottom of the substrate 101 to the top surfaces of the STI structures 104a, 104b and 104c as well as the top surfaces of the sub-fins 102a, 102b, 102c and 102d.

Subsequently, a plurality of dummy gate structures 105 are formed on the sub-fins 102a, 102b, 102c and 102d in a manner of covering the top surface of the sub-fins 102a, 102b, 102c and 102d as well as covering two opposite sidewalls of the sub-fins 102a, 102b, 102c and 102d connected to the top surface thereof. Meanwhile, a plurality of dummy stacks 109a, 109b, 109c and 109d are formed on the top surfaces of the STI structures 104a, 104b and 104c by the same process.

In some embodiments of the present invention, the process for forming the dummy gate structures 105 and the dummy stacks 109a, 109b, 109c and 109d comprise steps as follows: A gate dielectric layer 106, an amorphous silicon layer 107 and a hard mask layer 108 are formed in sequence on the sub-fins 102a, 102b, 102c and 102d as well as the STI structures 104a, 104b and 104c. Next, the hard mask layer 108 is patterned by a lithography-etching process. An etching process using the patterned hard mask layer 108 as a mask is performed to define the dummy gate structures 105 disposed on the sub-fins 102a, 102b, 102c and 102d as well as to define the dummy stacks 109a, 109b, 109c and 109d disposed on the STI structures 104a, 104b and 104c, as shown in FIG. 1B and FIG. 1B'.

Figure 1B:
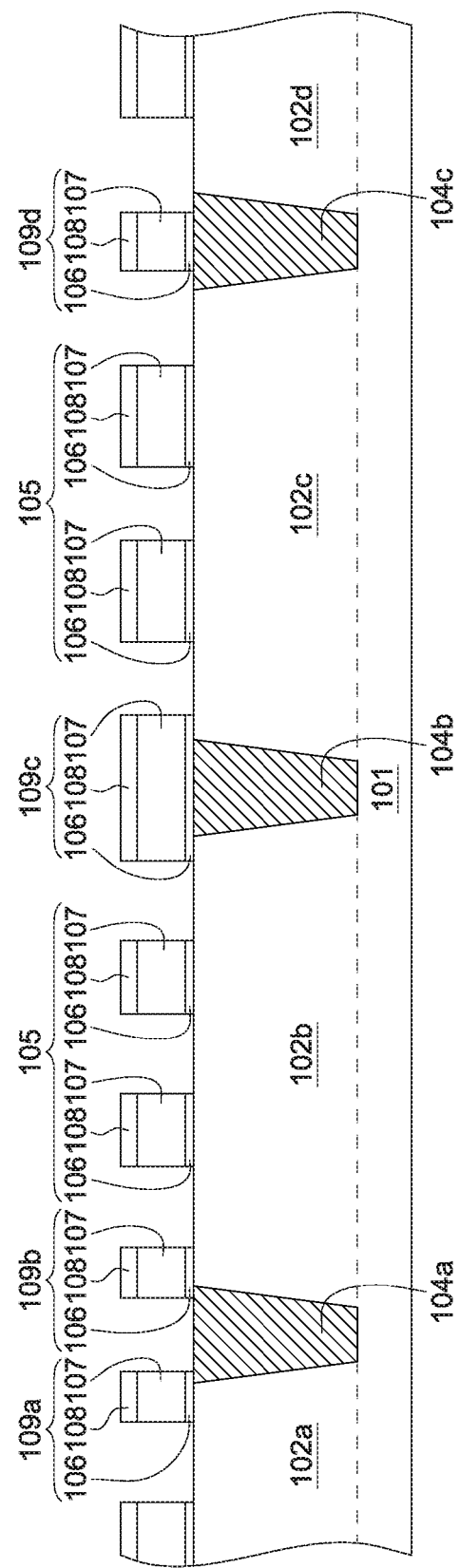
FIG. 1B is a cross-sectional view illustrating the result after the dummy gate structures and the dummy stacks are respectively formed on the structure of FIG. 1A'.
Figure 1B:
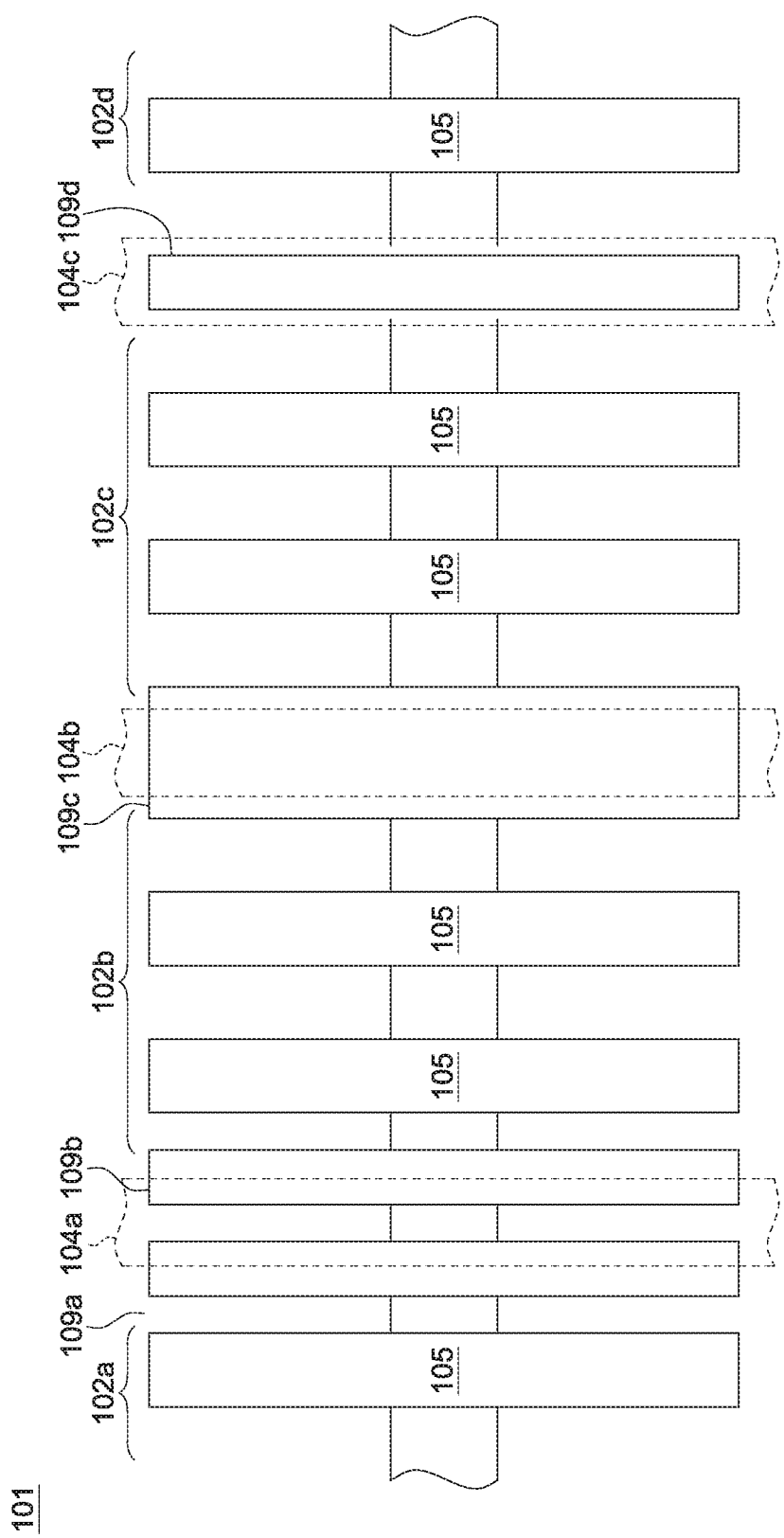

FIG. 1B is a cross-sectional view illustrating the result after the dummy gate structures 105 and the dummy stacks 109a, 109b, 109c and 109d are respectively formed on the structure of FIG. 1A'. FIG. 1B' is a top view illustrated in accordance with the structure of FIG. 1B. In the present embodiment, the dummy stacks 109a and 109b are formed on the STI structure 104a and laterally extend beyond the STI structure 104a along the long axis (the directions respectively directed towards the sub-fin 102a and the sub-fin 102b) of the fin structure 102, so as to partially overlap with the he sub-fin 102a and the sub-fin 102b respectively. Wherein the portion of the dummy stacks 109a extending beyond the STI structure 104a overlaps with a portion of the sub-fin 102a and the portion of the dummy stacks 109b extending beyond the STI structure 104b overlaps with a portion of the sub-fin 102b. The dummy stack 109c formed on the STI structure 104b also laterally extends beyond the STI structure 104b along the long axis of the fin structure 102, so as to partially overlap with the he sub-fin 102b and the sub-fin 102c. The dummy stack 109c formed on the STI structure 104c does not extend beyond the STI structure 104c.

A plurality of spacers 110 are then formed on the sidewalls of the dummy gate structures 105 and the dummy stacks 109a, 109b, 109c and 109d. Next, a plurality of source/drain structures 112 are formed in the sub-fins 102a, 102b, 102c and 102d respectively in adjacent to the corresponding dummy gate structures 105. In some embodiments of the present invention, the forming of the source/drain structures 112 comprises etching the fin structure 102 to form a plurality of openings (not shown) and performing a series deposition and implantation processes to form the source/drain structure 112 having an epitaxial SiGe/silicon phosphide (SiP) in the openings. Whereby, a plurality of transistors with different conductivities, such as N-type transistors 113N and P-type transistors 113P, (in accordance with the conductivity of the source/drain structures 112) are configured by integrating the plurality of dummy gate structures 105 with the plurality of the source/drain structures 112.

After the N-type transistors 113N and the P-type transistors 113P are formed, an interlayer dielectric (ILD) 111 are formed to cover on the N-type transistors 113N, the P-type transistors 113P and the dummy stacks 109a, 109b, 109c and 109d as well as to fill the gaps formed between the dummy gate structures 105 and the dummy stacks 109a, 109b, 109c and 109d. The ILD 111 is then subjected to a planarization process to form the structure as shown in FIG. 1C.

After the planarization process of the ILD 111, a dummy gate removing process is performed to remove the dummy gate structures 105. In some embodiments of the present invention, at least one of the dummy stacks 109a, 109b, 109c and 109d may be removed during the dummy gate removing process. In some other embodiments, all of the dummy stacks 109a, 109b, 109c and 109d are remained after the dummy gate removing process is carried out. In some case, one of the remained dummy stacks may serve (but not limited) as a passive device, such as a resistor, integrated in the semiconductor IC 100, in accordance with the design of the semiconductor IC 100. For the purpose of clear description, in the present embodiment, merely a dummy stack, such as the dummy stack 109c disposed on the STI structure 104b, is removed by the dummy gate removing process. However, it should be appreciated that the example just illustrated but not limit the scope of the present invention.

Figure 1C:
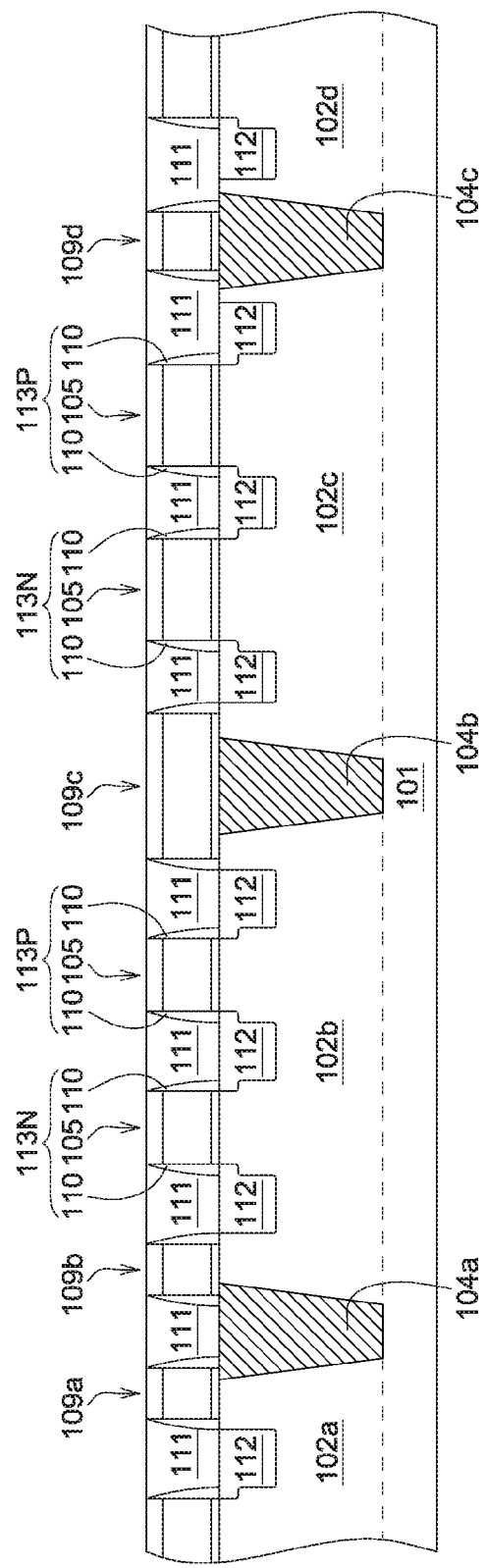
FIG. 1C is a cross-sectional view illustrating the result after the N-type transistors, the P-type transistors and the interlayer dielectric (ILD) are respectively formed on the structure of FIG. 1B.
Figure 1D:
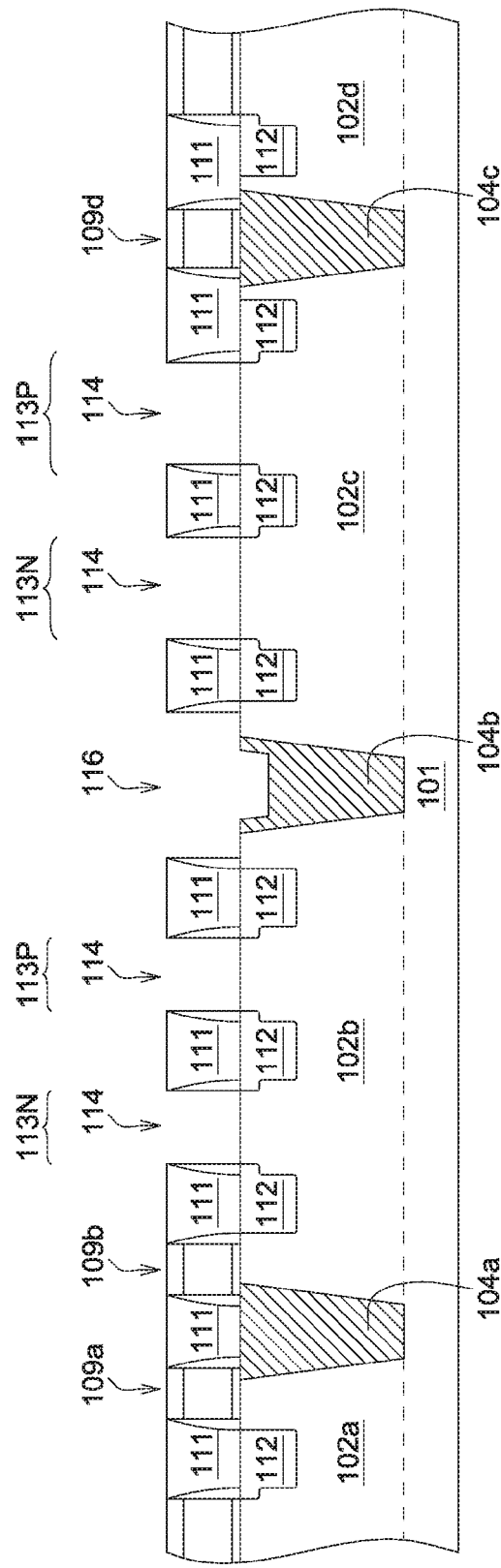
FIG. 1D is a cross-sectional view illustrating the result after the structure of FIG. 1C is subjected the dummy gate removing process.

FIG. 1D is a cross-sectional view illustrating the result after the structure of FIG. 1C is subjected the dummy gate removing process. The dummy gate removing process comprises a plurality of etching steps used to remove the dummy gate structures 105 of the N-type transistors 113N and the P-type transistors 113P, by which a plurality of openings 114 are formed to expose portions of the sub-fins 102a, 102b, 102c and 102d. For example, in some embodiments of the present invention, an etching process using a patterned photoresist layer (not shown) covering on the P-type transistors 113P as a mask is firstly performed to remove the dummy gate structures 105 of the N-type transistors 113N; and then another etching process using another patterned photoresist layer (not shown) covering on the N-type transistors 113N as a mask is then performed to remove the dummy gate structures 105 of the P-type transistors 113P. In the present embodiment, since the dummy stack 109c disposed on the STI structure 104b are not covered by the patterned photoresist layers either covering on the N-type transistors 113N or covering on the P-type transistors 113P during the etching processes, thus the dummy stack 109c can be thoroughly removed by the dummy gate removing process. Besides a portion of the STI structure 104b beneath the dummy stack 109c may be also removed by the dummy gate removing process, so as to form an opening 116 extending into the STI structure 104b and having a bottom lower than the top surfaces of the sub-fins 102a, 102b, 102c and 102d.

Figure 1E:
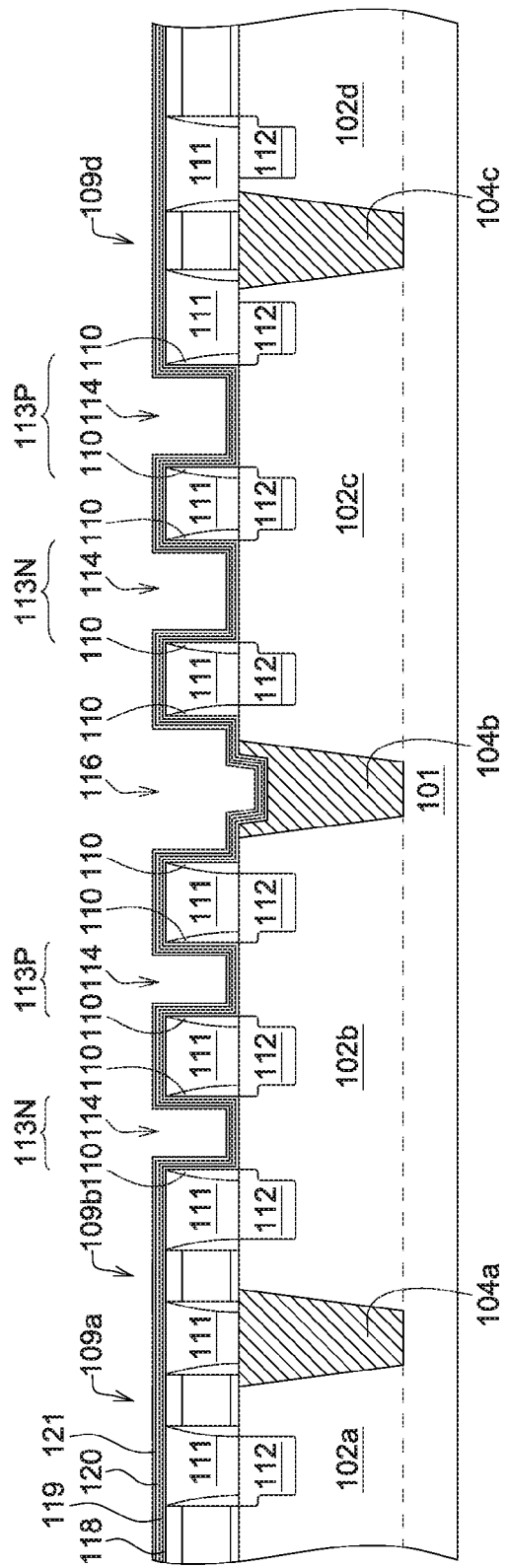
FIGS. 1E to 1G are cross-sectional view illustrating the method for forming a plurality of high dielectric constant (high-k) metal gate structures on the structure of FIG. 1D.
Figure 1F:
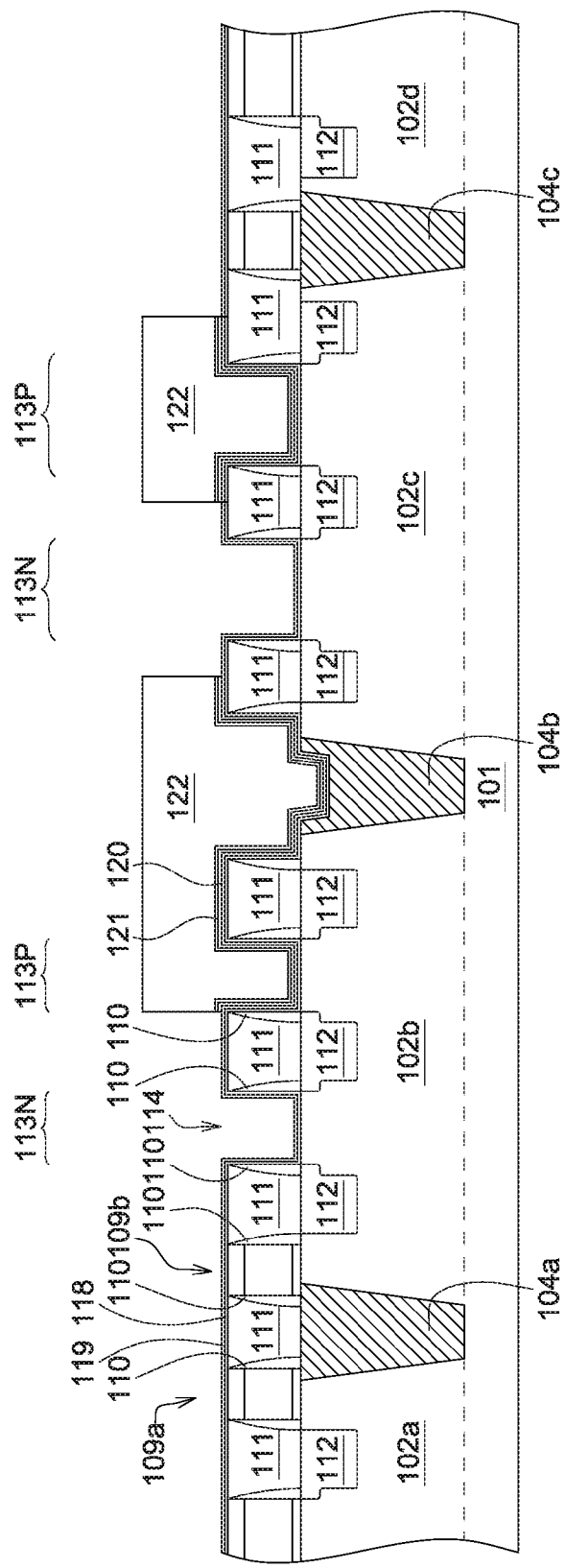
Figure 1G:
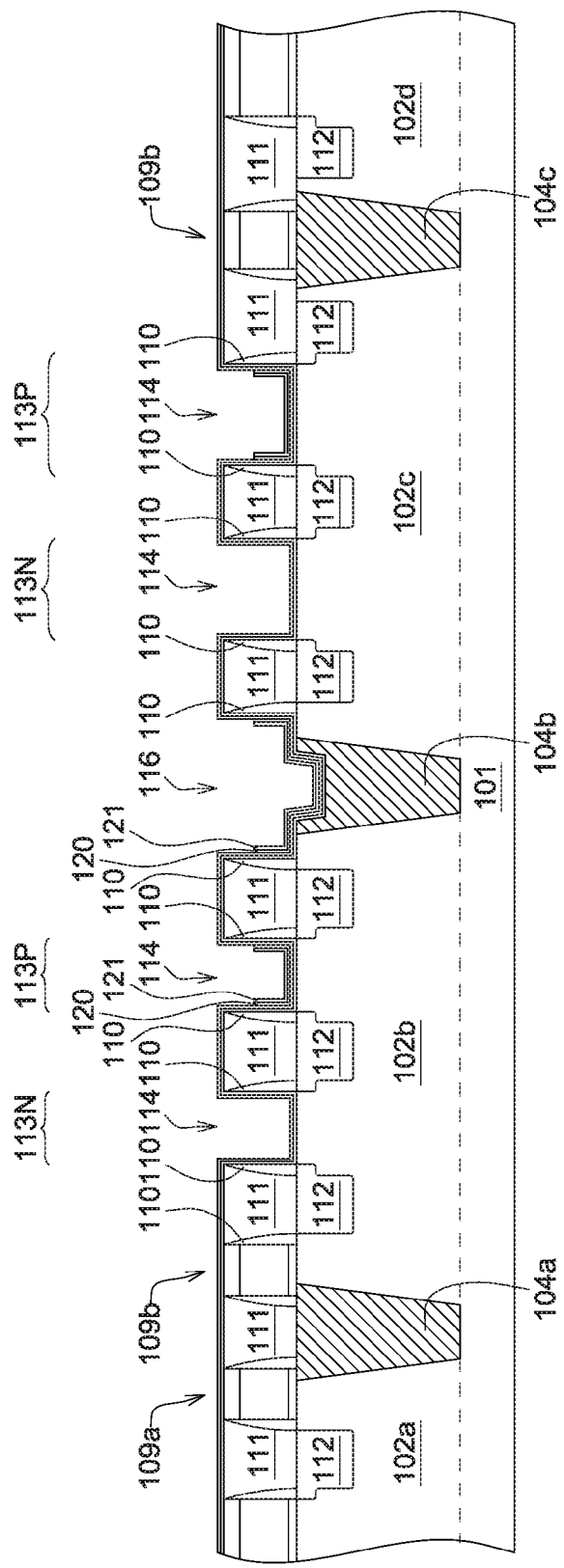

Subsequently, a plurality of high dielectric constant (high-k) metal gate structures, such as a plurality of N-type high-k metal gate structures 117N and a plurality of P-type high-k metal gate structures 117P, are formed in the openings 114, and the layers for forming the N-type high-k metal gate structures 117N and the P-type high-k metal gate structures 117P are respectively filled in the corresponding opening 116. In some embodiments of the present invention, the forming of the N-type high-k metal gate structures 117N and the P-type high-k metal gate structures 117P comprises steps as follows: Firstly, a high-k dielectric layer 118, a titanium nitride (TiN) liner layer 119, a tantalum nitride (TaN) barrier layer 120 and at least one P-type work function layer (such as a TiN work function layer) 121 are formed on the ILD 111, the N-type transistors 113N, the P-type transistors 113P and the dummy stacks 109a, 109b, 109c and 109d in sequence as well as covering on the bottom and sidewalls of the openings 114 and 116 (as shown in FIG. 1E). An etching process is then performed using a patterned photoresist layer 122 that covers on the P-type transistors 113P and fills into the opening 116 as a mask, and using the TaN barrier layer 120 as the stop layer to remove a portion of the TiN work function layer 121 (as shown in FIG. 1F). After the patterned photoresist layer 122 is peeled, the other portion of the TiN work function layer 121 covering on the P-type transistors 113P and the bottom and the sidewalls of the opening 116 are remained (as shown in FIG. 1G).

Next, at least one N-type work function layer (such as a titanium-aluminum carbide (TiCAl) work function layer) 123 and a TiN deposition layer 124 are formed in sequence on the TiN liner layer 119 and the remaining portion of the TiN work function layer 121. A metal material 125, such as copper (Cu), aluminum (Al), tungsten (W) other suitable metal or the combinations thereof, is then filled in the openings 114 of the N-type transistors 113N and the P-type transistors 113P as well as filled in the opening 116 disposed on the STI structure 104b. After a planarization process is carried out, the N-type high-k metal gate structures 117N each consisting of the high-k dielectric layer 118, the TiN liner layer 119, the TiCAl work function layer 123, TiN deposition layer 124 and the metal material 125 are formed in the N-type transistors 113N; the P-type high-k metal gate structures 117P each consisting of the high-k dielectric layer 118, the TiN liner layer 119, the TaN barrier layer 120, the TiN work function layer 121, the TiCAl work function layer 123, TiN deposition layer 124 and the metal material 125 are formed in the P-type transistors 113P; and a dummy structure 126 consisting of the high-k dielectric layer 118, the TiN liner layer 119, the TaN barrier layer 120, the TiN work function layer 121, the TiCAl work function layer 123, TiN deposition layer 124 and the metal material 125 is formed on the STI structure 104b. Thus, identical to the N-type high-k metal gate structures 117N and the P-type high-k metal gate structures 117P, the dummy structure 126 has a u-shaped high-k dielectric layer 118 and at least one u-shaped metal layer (selected from the TiN liner layer 119, the TaN barrier layer 120, the TiN work function layer 121, the TiCAl work function layer 123, TiN deposition layer 124 and the metal material 125) conformally extending downwards into the opening 116 and extending upwards beyond the STI structure 104b to form a stepped structure overlapping on the sidewalls and the bottom of the opening 116, a portion of the sub-fin 102b and a portion of the sub-fin 102c. In some embodiments of the present invention, the u-shaped high-k dielectric layer 118 of the dummy structure 126 is directly in contact with the STI structure 104b. After a series downstream processes are performed, the semiconductor IC 100 having at least one FinFET and dummy structure 126, as shown in FIG. 1H, is then prepared.

Figure 1H:
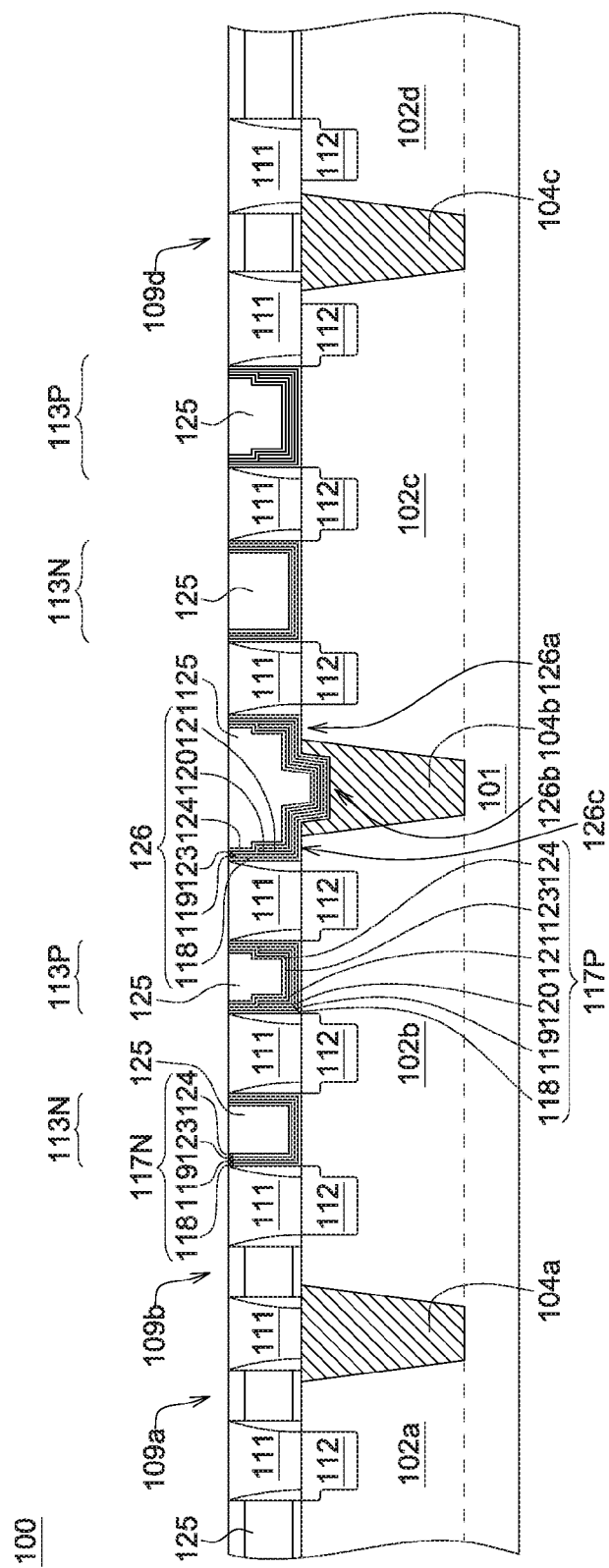
FIG. 1H is a cross-sectional view illustrating a semiconductor IC having a having at least one FinFET and a dummy structure in accordance with one embodiment of the present invention.
Figure 1H:
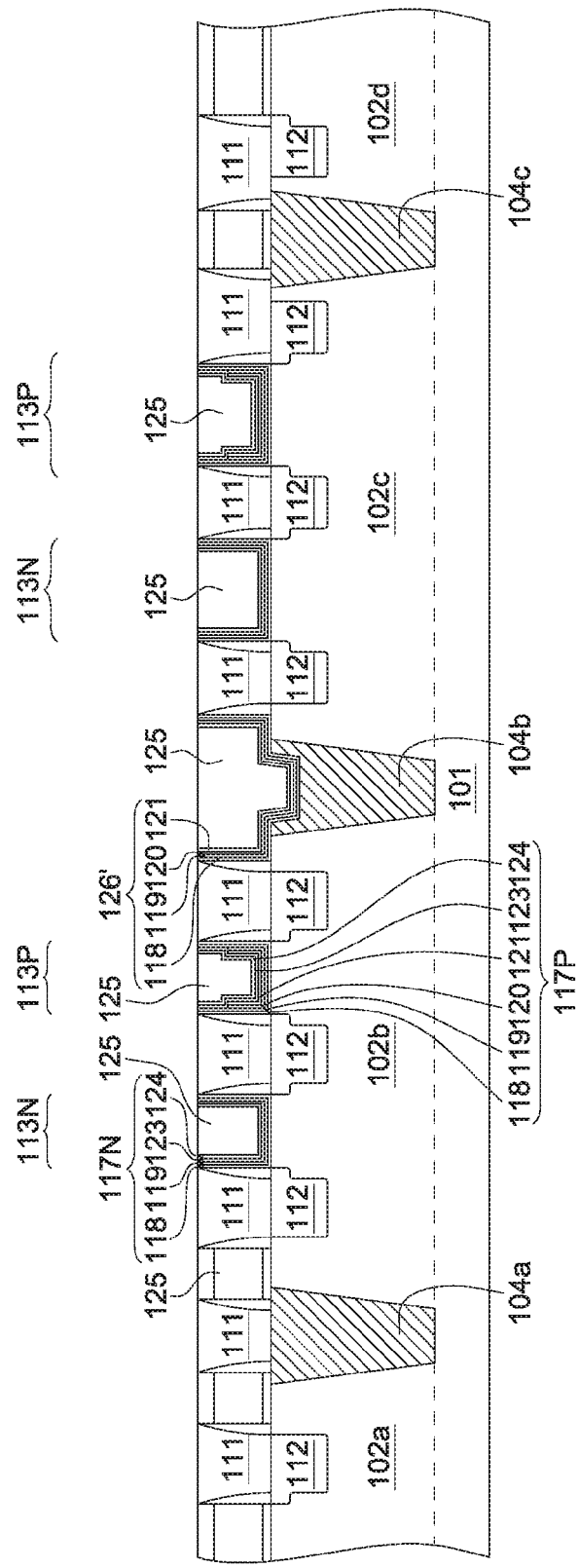

It should be appreciated that, although the dummy structure 126 formed on the STI structure 104b illustrated in FIG. 1H of the present embodiment has a stack structure identical to that of the N-type high-k metal gate structures 117N, it is not intended to limit the scope of the present invention. In some other embodiments, a dummy structure 126' formed on the STI structure 104b having a stack structure identical to that of the P-type high-k metal gate structures 117P (as shown in FIG. 1H') may be provided by varying the pattern of the patterned photoresist layer 122 during the process for forming the N-type high-k metal gate structures 117N and the P-type high-k metal gate structures 117P. In yet another embodiment, the opening 116 disposed on the STI structure 104b may be filled with one or more layers that is used to form the N-type high-k metal gate structures 117N or the P-type high-k metal gate structures 117P, whereby the dummy structure 126 formed in the opening 116 has one or more layers used to form the N-type high-k metal gate structures 117N or the P-type high-k metal gate structures 117P. In further yet another embodiment, the opening 116 disposed on the STI structure 104b may be filled with materials that are different form that used to form the N-type high-k metal gate structures 117N or the P-type high-k metal gate structures 117P, whereby the dummy structure 126 formed in the opening 116 has a stack structure different form that of the N-type high-k metal gate structures 117N and the P-type high-k metal gate structures 117P.

Figure 2:
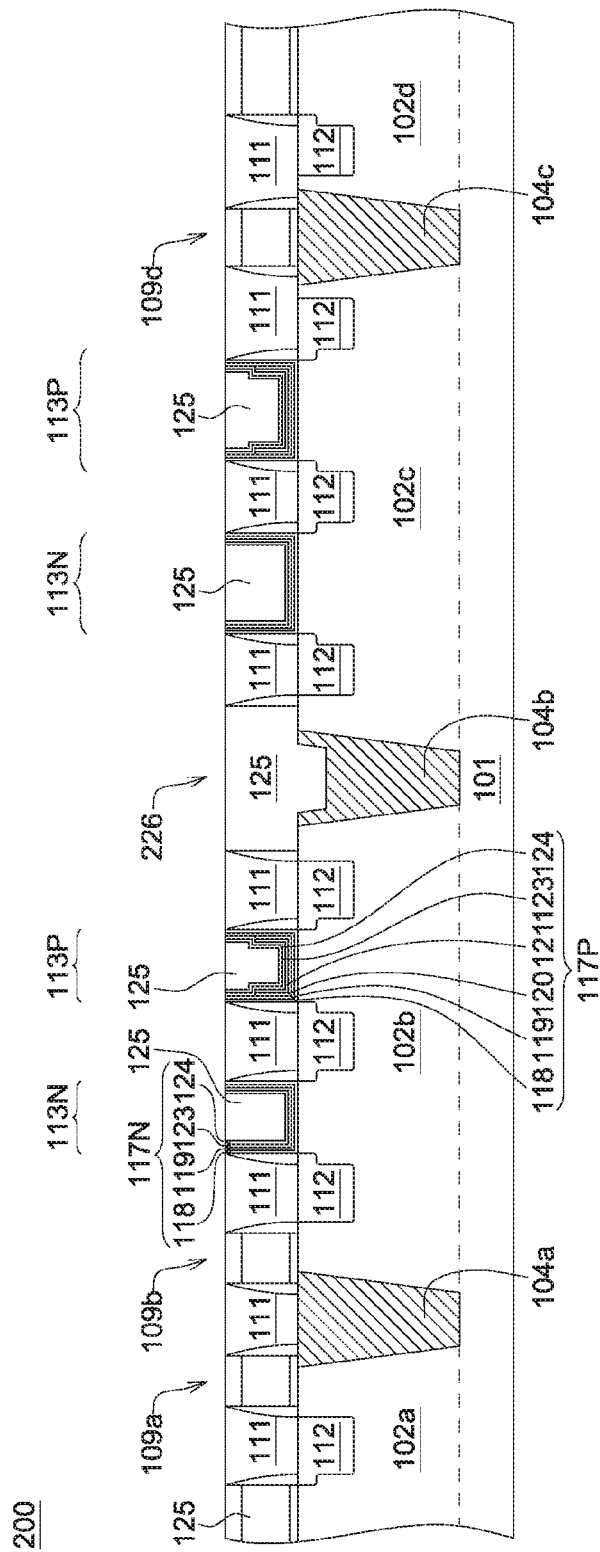
FIG. 2 is a cross-sectional view illustrating a semiconductor IC having at least one FinFET and a dummy structure in accordance with yet another embodiment of the present invention.

For example, FIG. 2 is a cross-sectional view illustrating a semiconductor IC 200 having an N-type high-k metal gate structure 117N, a P-type high-k metal gate structure 117P and a dummy structure 226 in accordance with one embodiment of the present invention. The physical structure of the semiconductor IC 200 is similar with that of the semiconductor IC 100; the difference between these two semiconductor ICs is that the dummy structure 226 of the semiconductor IC 200 is merely made of the metal material 125 but not include any work function layer used for constituting the N-type high-k metal gate structures 117N and P-type high-k metal gate structures 117P. In other words, in the present embodiment, the dummy structure 226 has a stack structure different from that of the N-type high-k metal gate structures 117N and the P-type high-k metal gate structures 117P, nevertheless the process for forming the dummy structure 226 is simultaneous to the process for forming the N-type high-k metal gate structures 117N and P-type high-k metal gate structures 117P.

In addition, it must be appreciated that the method and the process for forming the dummy structure 126 on the STI structure 104b is just illustrated. The aforementioned method and the process can also be applied to form a dummy structure similar or identical to the dummy structure 126 or 226 on the other STI structures, such as the STI structures 104a or 104c.

Please referring to the FIG. 1H again, the dummy structure 126 formed on the STI structure 104b comprises an extending portion 126a overlapping portions of the adjacent sub-fins 102b and 102c and an extending portion 126b extending into the STI structure 104b. In the present embodiment, the bottom of the extending portion 126b is lower than the bottom of the N-type high-k metal gate structures 117N and the bottom of the P-type high-k metal gate structures 117P. Since the top surfaces of the STI structure 104b and the sub-fins 102b and 102c form a plan, in addition, the N-type high-k metal gate structures 117N and the P-type high-k metal gate structures 117P are formed on the sub-fins 102b by the same process, thus the bottom 126c of the dummy structure 126 and the bottoms of the N-type high-k metal gate structures 117N and P-type high-k metal gate structures 117P have an identical height measured from the bottom of the substrate 101. An even local pattern density may be provided by a proper arrangement of the dummy structure 126 formed at the peripheral region of the N-type high-k metal gate structures 117N and P-type high-k metal gate structures 117P, whereby, the dishing problems and the defect of the semiconductor device resulting from the uneven force of the subsequent processes performed on the semiconductor fin can be avoided.

Figure 3:
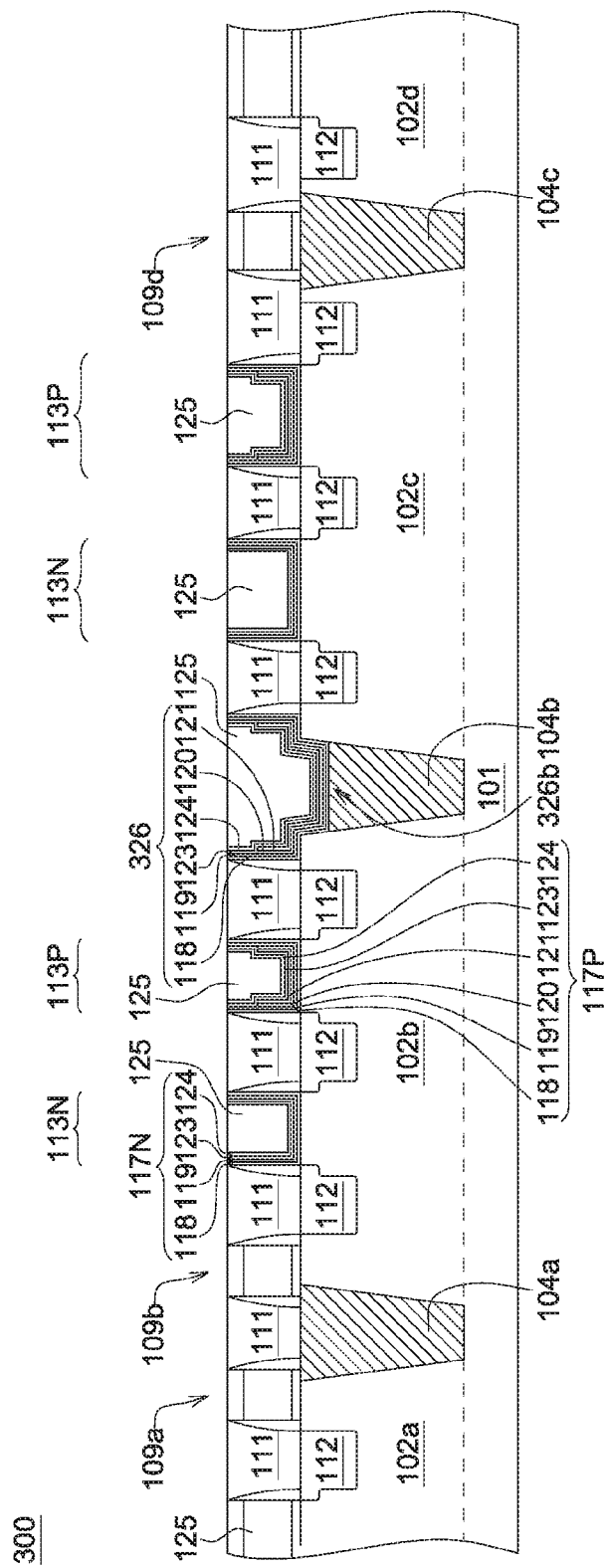
FIG. 3 a cross-sectional view illustrating a semiconductor IC 300 having at least one FinFET and a dummy structure in accordance with yet another embodiment of the present invention.

FIG. 3 a cross-sectional view illustrating a semiconductor IC 300 having a N-type high-k metal gate structure 117N, a P-type high-k metal gate structure 117P and a dummy structure 326 in accordance with yet another embodiment of the present invention. The physical structure of the semiconductor IC 300 is similar with that of the semiconductor IC 100; the difference between these two semiconductor ICs is that the extending portion 326b not only extends into the STI structure 104b, but also substitutes the top portion the STI structure 104b. In these cases, the extending portion 326b is directly in contact with the sub-fins 102b and 102c. In the present embodiment, the forming of the extending portion 326b comprises removing the top portion of the STI structure 104b to form the opening 116 by the dummy gate removing process (as shown in FIG. 1D), and forming the dummy structure 326 in the opening 116 to make the extending portion 326b directly in contact with the sub-fins 102b and 102c.

In accordance with the aforementioned embodiments of the present invention, a semiconductor device and method for fabricating the same are provided. A substrate having a surface from which a semiconductor fin protrudes is provided. An isolation structure is then provided in the semiconductor fin to divide the semiconductor fin into a first sub-fin and a second sub-fin and electrically isolate the first sub-fin and the second sub-fin. Subsequently, a plurality of gate structures are formed on the first sub-fin and the second sub-fin, and at least one dummy structure is formed on the isolation structure by the identical process for forming the gate structures, wherein the dummy structure laterally extends beyond the first isolation structure along a long axis of the semiconductor fin in a manner of overlapping a portion of the first sub-fin and a portion of the second sub-fin.

Since the isolation structure has a top surface substantially conformal to the top surfaces of the first sub-fin and the second sub-fin, the top surfaces of the isolation structure, the first sub-fin and the second sub-fin can form a plane. In addition, because the dummy structure and the gate structures are formed by the same process for patterning the same material layers coving on the plane constituted by the top surfaces of the isolation structure, the first sub-fin and the second sub-fin, the dummy structure and the gate structures can have an identical height measured from the bottom of the substrate to the top surface thereof. Thereby, an even local pattern density can be provided by a proper arrangement of the dummy structure formed at the peripheral region of the gate structures, the dishing problems and the defect of the semiconductor device resulting from the uneven force of the subsequent processes performed on the semiconductor fin thus can be avoided.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a semiconductor device, comprising:
   providing a semiconductor fin having a first sub-fin and a second sub-fin protruding from a surface of a substrate;
   providing a first isolation structure, disposed in the semiconductor fin, having an opening extending therein and used for electrically isolating the first sub-fin and the second sub-fin;
   forming a first dummy structure disposed on the first isolation structure and having at least one metal layer entirely overlapping on the first isolation structure along a long axis of the semiconductor fin, wherein the metal layer laterally conformally extends downwards into the opening formed in the first isolation structure and extends upwards beyond the first isolation structure along the long axis of the semiconductor fin, so as to form a stepped structure overlapping on sidewalls and a bottom of the opening, a portion of the first sub-fin and a portion of the second sub-fin.

2. The method according to claim 1, wherein the first isolation structure comprises a shallow trench isolation (STI).

3. The method according to claim 1, wherein the step for forming the first dummy structure comprises:
   forming a gate dielectric layer and a poly-silicon layer on the first sub-fin, the second sub-fin and the first isolation structure;
   patterning the gate dielectric layer and the poly-silicon layer to respectively form at least one dummy gate structure on the first sub-fin and the second sub-fin and to form a stack structure on the first isolation structure, wherein the stack structure laterally extends beyond the first isolation structure along the long axis of the semiconductor fin in a manner of partially overlapping a portion of the first sub-fin and a portion of the second sub-fin;
   removing the dummy gate structure and the stack structure to expose a portion of the first sub-fin, a portion of the second sub-fin and the first isolation structure;
   forming a high-k dielectric layer and a metal layer on the exposed first sub-fin, the second sub-fin and the first isolation structure.

4. The method according to claim 3, further comprising process for forming a source/drain structure adjacent to one of the dummy gate structure before the step of removing the dummy gate structure and the stack structure is carried out.

5. The method according to claim 4, further comprising steps of forming an interlayer dielectric (ILD) on portions of the first sub-fin and the second sub-fin not covered by the at least one dummy gate structure prior to removing the dummy gate structure.

6. The method according to claim 5, wherein the step for removing the stack structure comprises process of forming the opening extending downwards from a top surface of the first isolation structure to a level lower than a top surface of the semiconductor fin.

7. The method according to claim 6, further comprising:
   forming a plurality of gate structures respectively having portions of the high-k dielectric layer and a metal layer and disposed on portions of the first sub-fin and the second sub-fin not covered by the ILD;
   wherein the first dummy structure has a first extending portion laterally extending beyond the first isolation structure along the long axis of the semiconductor fin to partially overlap a portion of the first sub-fin and a portion of the second sub-fin and a second extending portion extending into the opening, wherein the first extending portion has a height identical to that of the gate structures both are measured from a bottom of the substrate to bottoms of the first extending portion and the gate structures, and the second extending portion has a bottom lower than the bottoms of the gate structures.

8. The method according to claim 7, wherein the first dummy structure has a structure different form that of the gate structures.

9. The method according to claim 7, wherein one of the gate structures is a N-type gate structure having a N-type work function layer; one of the gate structures is a P-type gate structure having a P-type work function layer; and the first dummy structure comprises the N-type work function layer and the P-type work function layer.

10. The method according to claim 7, wherein one of the gate structures is a N-type gate structure having a N-type work function layer; one of the gate structures is a P-type gate structure having a P-type work function layer; and the first dummy structure does not comprise the N-type work function layer and the P-type work function layer.

11. The method according to claim 7, wherein one of the gate structures is a N-type gate structure having a N-type work function layer, the first dummy structure has a structure identical to that of the N-type gate structure.

12. The method according to claim 7, wherein one of the gate structures is a P-type gate structure having a P-type work function layer, the first dummy structure has a structure identical to that of the P-type gate structure.

13. The method according to claim 1, wherein the step for forming the first dummy structure comprises:
   forming a u-shaped high dielectric constant (high-k) dielectric layer in the opening and directly in contact with the first isolation structure; and
   forming at least one metal layer on the u-shaped high-k dielectric layer.

14. The method according to claim 1, wherein the step for forming the gate structures comprises:
   forming at least one u-shaped high-k dielectric layer on the semiconductor fin; and
   forming at least one metal layer on the at least one u-shaped high-k dielectric layer.

15. The method according to claim 1, wherein the step for forming the first dummy structure comprises:
   forming a dielectric layer on the semiconductor fin and the first isolation structure; and
   forming a poly-silicon layer on the dielectric layer.

16. The method according to claim 1, further comprising:
   forming a second isolation structure in the semiconductor fin for electrically isolating the first sub-fin and a third sub-fin of the semiconductor fin; and
   forming a second dummy structure on the second isolation structure to make the second dummy structure merely overlapping with the second isolation structure.

17. The method according to claim 16, wherein the first dummy structure and the second dummy structure are formed simultaneously.

18. The method according to claim 16, wherein bottoms of the first dummy structure and the second dummy structure form a plane with the bottoms of the gate structures.

* * * * *